(12) United States Patent
Lee et al.

(10) Patent No.: US 6,893,782 B2
(45) Date of Patent: May 17, 2005

(54) METHOD OF FABRICATING COLOR FILTER SUBSTRATE FOR LIQUID CRYSTAL DISPLAY DEVICE

(75) Inventors: Jung-Jae Lee, Gyeonggi (KR); Sam-Yeoul Kim, Gyeonggi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/728,764

(22) Filed: Dec. 8, 2003

(65) Prior Publication Data

US 2004/0126680 A1 Jul. 1, 2004

(30) Foreign Application Priority Data

Dec. 9, 2002 (KR) .............................. 10-2002-0077949

(51) Int. Cl.[7] .......................... G02B 5/20; G02F 1/1335
(52) U.S. Cl. ........................ 430/7; 430/200; 430/945
(58) Field of Search .............................. 430/7, 200, 945

(56) References Cited

U.S. PATENT DOCUMENTS 5,981,112 A * 11/1999 Roberts .......................... 430/7
6,242,140 B1    6/2001 Kwon et al.
6,682,862 B1 *  1/2004 Chang et al. .................. 430/7

FOREIGN PATENT DOCUMENTS

| JP | 10-090513 A | * | 4/1998 |
| KR | 10-0247819 |   | 12/1999 |

OTHER PUBLICATIONS

Eran Elizur, et al. "Thermal Lithography for Flat Panel Display Manufacturing," *SID 02 Digest*. pp. 1055–1056.

* cited by examiner

*Primary Examiner*—John A. McPherson
(74) *Attorney, Agent, or Firm*—Morgan Lewis & Bockius LLP

(57) ABSTRACT

A method of fabricating a color filter substrate for a liquid crystal display device includes forming a black matrix on a substrate, adhering a color transcription film to the substrate, disposing a laser head over the color transcription film, repeatedly scanning a laser beam across a surface of the color transcription film using the laser head, removing the color transcription film so that a color filter pattern remains within color filter pattern regions defined by the black matrix, and polishing a surface of the color filter pattern to planarize a surface of the color filter pattern.

12 Claims, 10 Drawing Sheets

METHOD OF FABRICATING COLOR FILTER SUBSTRATE FOR LIQUID CRYSTAL DISPLAY DEVICE

The present invention claims the benefit of Korean Patent Application No. P2002-077949 filed in Korea on Dec. 9, 2002, which is hereby incorporated by reference.

BACKGROUND OF THE INVENTION

1. Field of the Invention

The present invention relates to a method of fabricating a display device, and more particularly, to a method of fabricating a color filter substrate for a liquid crystal display device.

2. Discussion of the Related Art

With rapid development within the information technology field, display devices have evolved to be able to process and display increasingly large amounts of information. Flat panel display technologies recently have been developed for display devices having small thickness, light weight, and low power consumption. Among these technologies, liquid crystal display (LCD) devices commonly have been used in notebook computers and desktop computer monitors due to their superior image resolution, color image display, and image quality.

In general, an LCD device includes an upper substrate, a lower substrate, and a liquid crystal layer disposed between the upper and lower substrates. The LCD device makes use of optical anisotropy of liquid crystal material and produces images by varying light transmittance according to the alignment of liquid crystal molecules by an electric field.

The lower substrate, which is commonly referred to as an array substrate, includes thin film transistors and pixel electrodes, and is fabricated using repeated photolithographic processes to pattern thin films. The upper substrate, which is commonly referred to as a color filter substrate, includes a color filter layer for displaying color images. The color filter layer commonly includes sub-color filters of red (R), green (G), and blue (B), and is formed by various methods including, for example, a dyeing method, an electro-deposition method, a pigment dispersion method, and a printing method. In general, the pigment dispersion method is more commonly used because it forms a fine pattern with good reproducibility.

FIGS. 1A to 1D are cross sectional views of a method of fabricating a color filter substrate for a liquid crystal display (LCD) device according to the related art. Here, the pigment dispersion method is used.

In FIG. 1A, a black matrix 15 is formed on an insulating substrate 10 by depositing a metal material or coating a resin, and patterning the metal material or the resin through a photolithographic processes. The black matrix 15 blocks light leakage, which is caused by irregular operation of liquid crystal molecules, within regions except for pixel electrodes of an array substrate (not shown). The black matrix 15 also prevents light from being transmitted into a channel of a thin film transistor of the array substrate.

In FIG. 1B, a color resist 17, which may be one of red, green, and blue resists, for example a red one, is coated onto the substrate 10 including the black matrix thereon by spin coating. A mask 20 having a light transmitting portion and a light blocking portion is disposed over the red resist 17, and the red resist 17 is exposed to light using the mask 20. Here, the red resist 17 is shown to have a negative property, i.e., a portion of the red resist 17 that is not exposed to light is removed.

In FIG. 1C, the red resist 17 (in FIG. 1B) is developed, and a red color filter pattern 17a is formed. Then, the red color filter pattern 17a is cured and hardened.

In FIG. 1D, green and blue color filter patterns 17b and 17c are formed on the black matrix 15 through similar processes, as shown in FIGS. 1B and 1C. Next, an overcoat layer 23 and a common electrode 25 are subsequently formed on the substrate 10 including the color filter patterns 17a, 17b, and 17c. The overcoat layer 23 protects the color filter patterns 17a, 17b, and 17c, and flattens the surface of the substrate 10 having the color filter patterns 17a, 17b, and 17c. The common electrode 25 is made of a transparent conductive material, such as indium-tin-oxide and indium-zinc-oxide.

During the fabrication method of the color filter substrate using the pigment dispersion, since the color filter substrate is fabricated by repeated processes of coating, exposing, developing, and curing of a color resist, the fabrication method is complicated and requires significant amounts of time and numerous pieces of equipment. To solve the above problem, a fabrication method of a color filter substrate using thermal imaging has been proposed, as disclosed for example in U.S. Pat. No. 6,242,140, which is hereby incorporated by reference.

FIGS. 2A to 2D are cross sectional views of another method of fabricating a color filter substrate using thermal imaging according to the related art. In FIG. 2A, a black matrix 35 is formed on an insulating substrate 30 by depositing a metal material or coating a resin, and patterning the metal material or the resin by photolithographic processes.

In FIG. 2B, a first color transcription film 40 is disposed over the substrate 30 including the black matrix 35. The first color transcription film 40 includes a supporting film 40a, a light-to-heat conversion (LTHC) layer 40b, and a color filter layer 40c.

In FIG. 2C, the first color transcription film 40 is adhered to the substrate 30 without bubbles. A laser head 50, from which a laser beam is generated, is disposed over the first color transcription film 40. Then, the laser beam is applied to the first color transcription film 40 within a portion where a first color filter pattern will be formed later while the laser head 50 is reciprocated along a straight line. In the first color transcription film 40 exposed to the laser beam, the LTHC layer 40b transforms light absorbed from the laser beam into thermal energy and emits the thermal energy. Accordingly, the color filter layer 40c is transferred onto the substrate 30 due to the emitted thermal energy. Here, the color filter substrate may be a stripe type where color filter patterns are disposed along a line each having the same color. Thus, a first line is exposed to the laser beam by moving the laser head along a straight line, but second and third lines are skipped. Similarly, a fourth line is exposed to the laser beam. Using these processes, all the lines of the first color filter pattern are exposed, and the first color transcription film 40 is removed.

In FIG. 2D, the first color filter pattern 45a is formed between the adjacent black matrixes 35 on the substrate 30, wherein the first color filter pattern 45a may be a red color filter. A second color filter pattern 45b and a third color filter pattern 45c are formed through the same process, as shown in FIGS. 2B and 2C, wherein the second and third color filer patterns 45b and 45c may be green and blue color filters, respectively. The substrate 30 having the color filter patterns 45a, 45b, and 45c is placed in a hardening furnace, and the color filter patterns 45a, 45b, and 45c are hardened. An overcoat layer 47 is formed on the color filter patterns 45a, 45b, and 45c in order to protect the color filter patterns 45a, 45b, and 45c, and to flatten the surface of the substrate 30 otherwise having steps. Next, a common electrode 49 is formed on the overcoat layer 47 by depositing a transparent conductive material, such as indium-tin-oxide and/or indium-zinc-oxide.

During the thermal imaging method, manufacturing throughput of the color filter substrate is influenced by an application direction of the laser beam, wherein the laser beam is applied to the transcription film along a direction parallel to a pixel length of the LCD device. For example, in a color filter substrate of a video graphic array (VGA) LCD device, which has a resolution of 640 by 480, the VGA LCD device has sub-pixels of 640 by 3 lines (i.e., 1920 lines). Thus, the laser head 50 must scan 640 times for each color filter pattern, and a total number of scans is 1920. In addition, a size of the pixel depends on the resolution being used (e.g., VGA, SVGA (super video graphic array), XGA (extended graphic array), and so on), thereby making it problematic to have a laser beam fit for each different pixel size.

The scanning of the laser head 50 may be accomplished along a direction parallel to a pixel width of the LCD device, thereby reducing the scanning times. This may be referred to as a horizontal laser scan. The manufacturing throughput of the color filter substrate is improved due to reduction of the scanning times. However, in this case, there is a problem that scanning traces may be formed at pixel regions, thereby reducing image quality.

FIG. 3 is a plan view of a color filter substrate fabricated by a thermal imaging method using a horizontal laser scan according to the related art. In FIG. 3, a substrate 30 includes a black matrix 35 and a color filter pattern 45 thereon, wherein the black matrix 35 has an opening in which the color filter pattern 45 is placed. The color filter pattern 45 is formed by the above-described thermal imaging method using a horizontal laser scan. A laser head 50 having a plurality of laser pixels 52 first scans the substrate 30 along a horizontal direction of the substrate 30 repeatedly turning the laser pixel 52 ON and OFF. After the first scan, the laser head 50 is moved along the vertical direction of the substrate 30 by a width of the first scan, and a second scan is accomplished. Here, a scanning trace 55 is formed along a border between first and second scanning regions, and is situated on the color filter pattern 45.

FIG. 4A is an enlarged view of a region A in FIG. 3 according to the related art, and FIG. 4B is a cross sectional view along IV—IV of FIG. 4A according to the related art.

In FIGS. 4A and 4B, after repeated laser scans, the scanning trace 55 is formed on the color filter pattern 45 because of scanning borders of the first and second scans. When a laser beam is applied to a light-to-heat conversion (LTHC) layer of a transcription film, photo energy from the laser beam applied to the LTHC layer is transformed into thermal energy. Accordingly, a color filter layer is transferred onto the substrate due to the thermal energy, wherein the color filter layer is actually transferred onto a larger area than the region actually exposed to the laser beam. In addition, due to difference in scanning times, spontaneous hardening of the color filter film, and the expansion rate of the color filter layer, the scanning trace 55 may have a certain thickness that protrudes over the surface of the color filter pattern 45. Thus, the scanning trace 55 on the color filter pattern 45 lowers image quality.

SUMMARY OF THE INVENTION

Accordingly, the present invention is directed to a method of fabricating a color filter substrate for a liquid crystal display device that substantially obviates one or more of problems due to limitations and disadvantages of the related art.

An object of the present invention is to provide a method of fabricating a color filter substrate for a liquid crystal display device that improves image quality.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a color filter substrate for a liquid crystal display device includes forming a black matrix on a substrate, adhering a color transcription film to the substrate, disposing a laser head over the color transcription film, repeatedly scanning a laser beam across a surface of the color transcription film using the laser head, removing the color transcription film so that a color filter pattern remains within color filter pattern regions defined by the black matrix, and polishing a surface of the color filter pattern to planarize a surface of the color filter pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
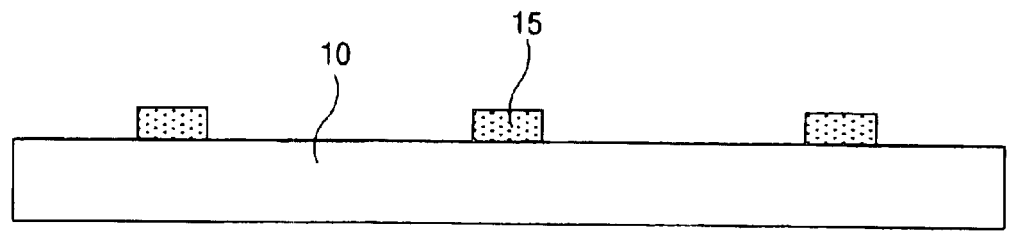
FIGS. 1A to 1D are cross sectional views of a method of fabricating a color filter substrate for a liquid crystal display (LCD) device according to the related art.
Figure 1B:
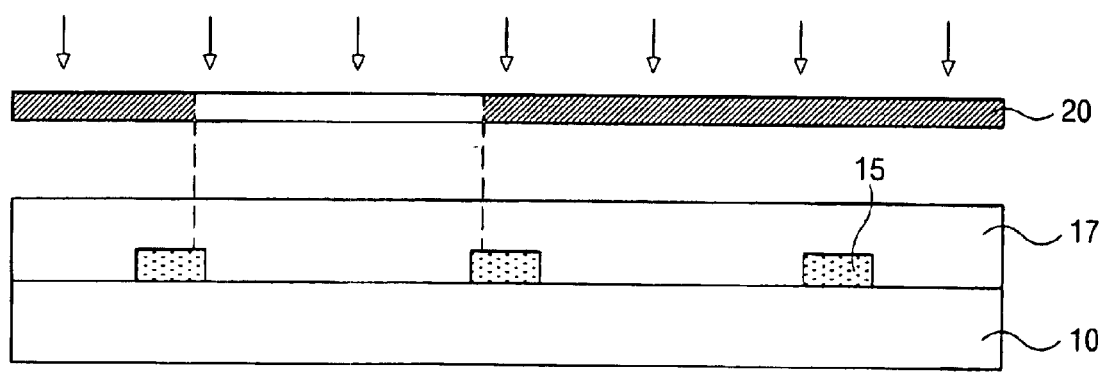
Figure 1C:
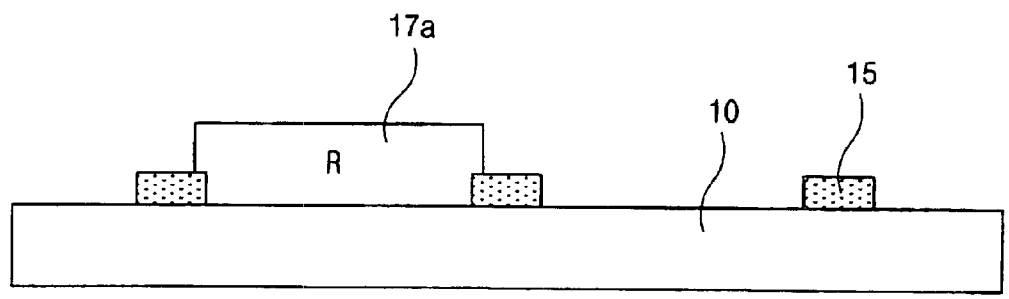
Figure 1D:
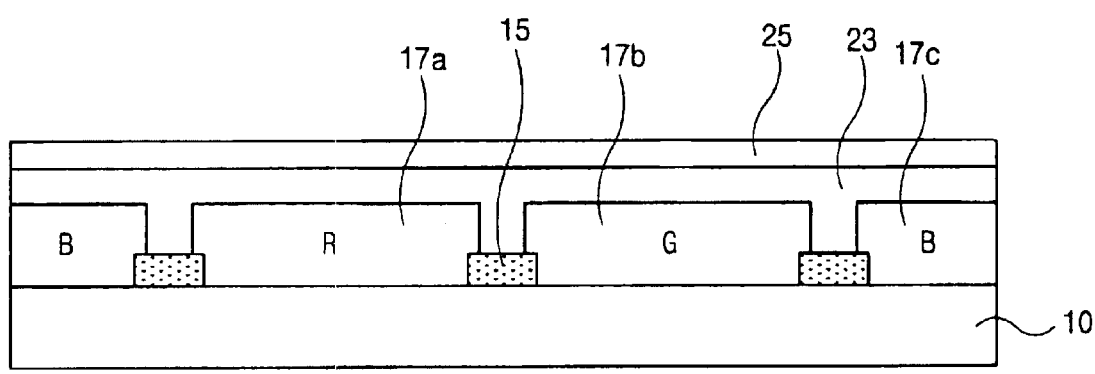
Figure 2A:
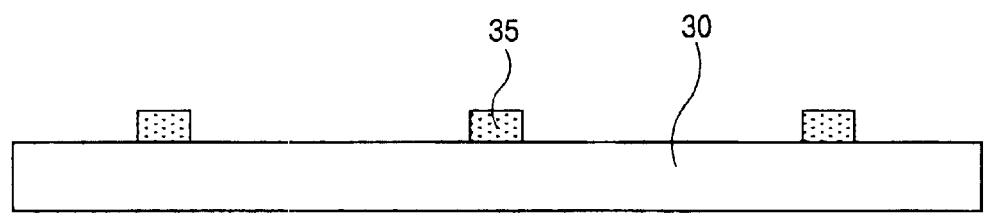
FIGS. 2A to 2D are cross sectional views of another method of fabricating a color filter substrate using thermal imaging according to the related art.
Figure 2B:
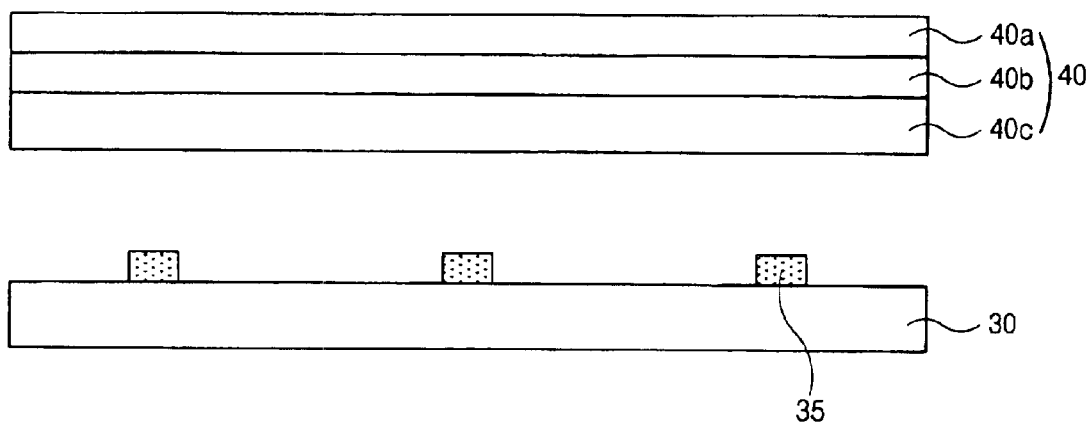
Figure 2C:
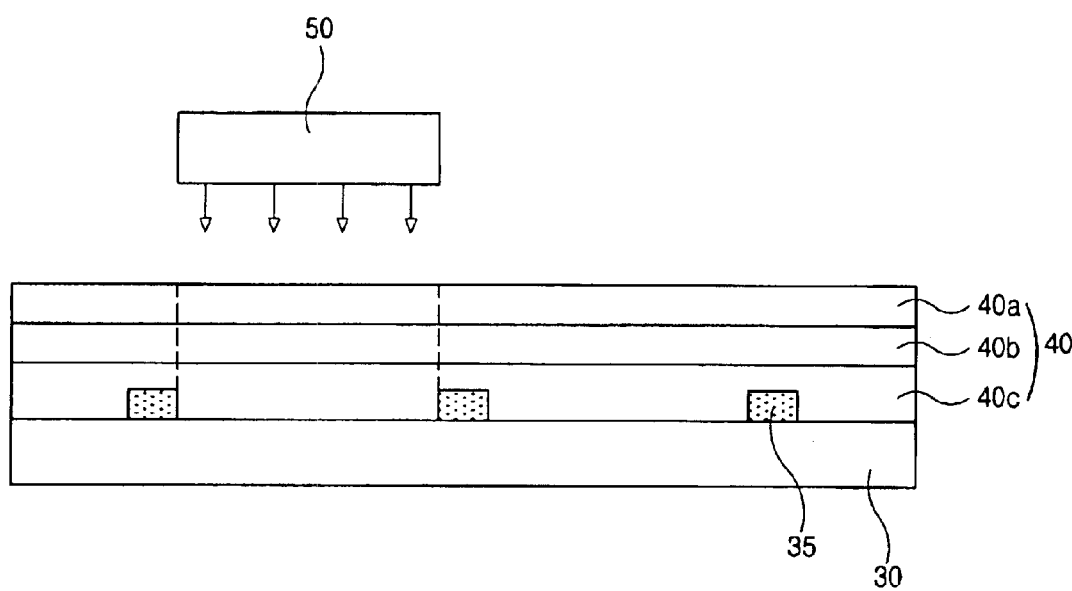
Figure 2D:
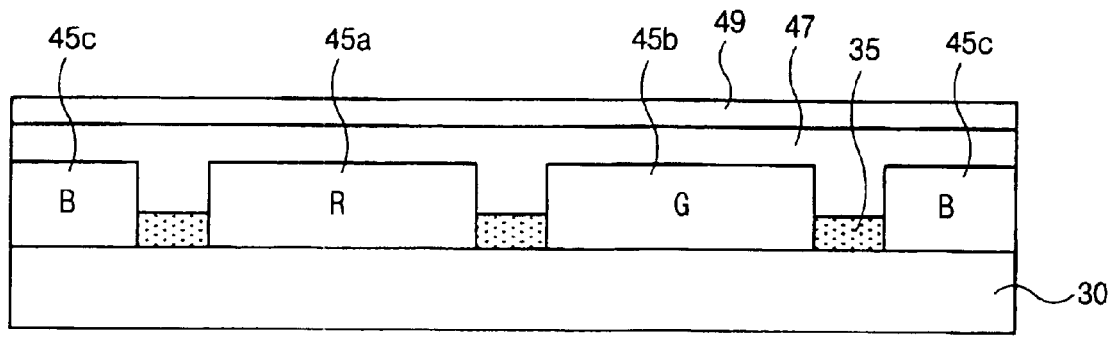
Figure 3:
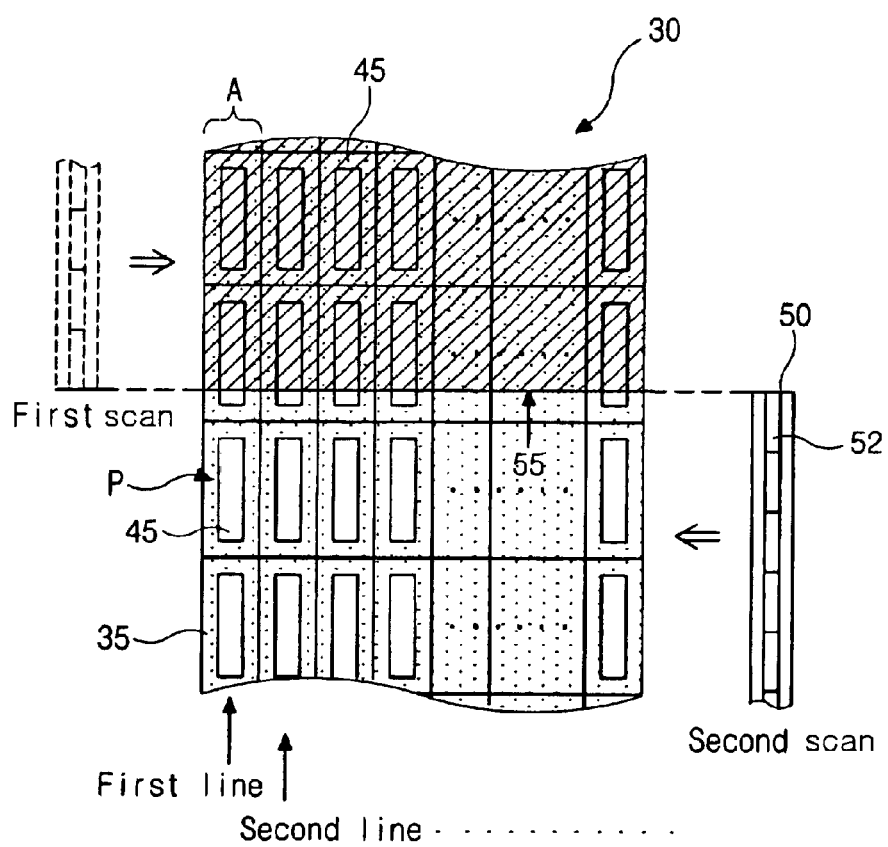
FIG. 3 is a plan view of a color filter substrate fabricated by a thermal imaging method using a horizontal laser scan according to the related art.
Figure 4A:
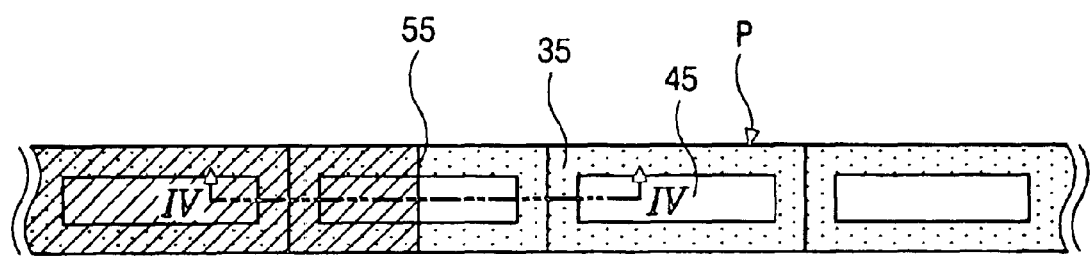
FIG. 4A is an enlarged view of a region A in FIG. 3 according to the related art.
Figure 4B:
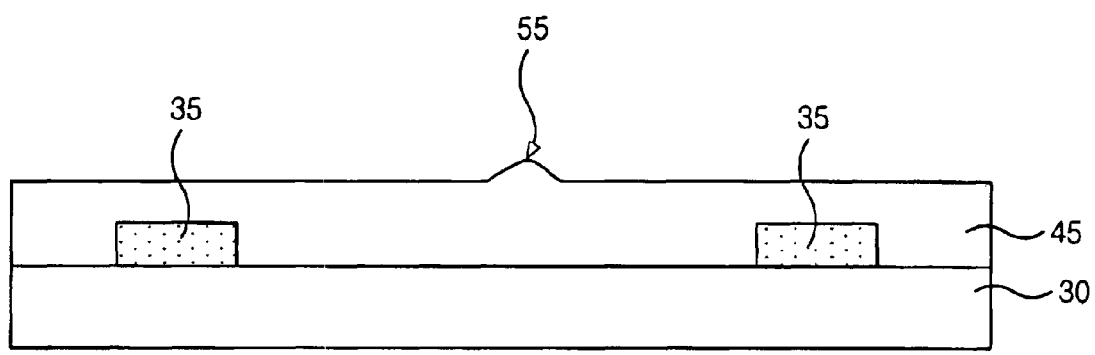
FIG. 4B is a cross sectional view along IV—IV of FIG. 4A according to the related art.
Figure 5A:
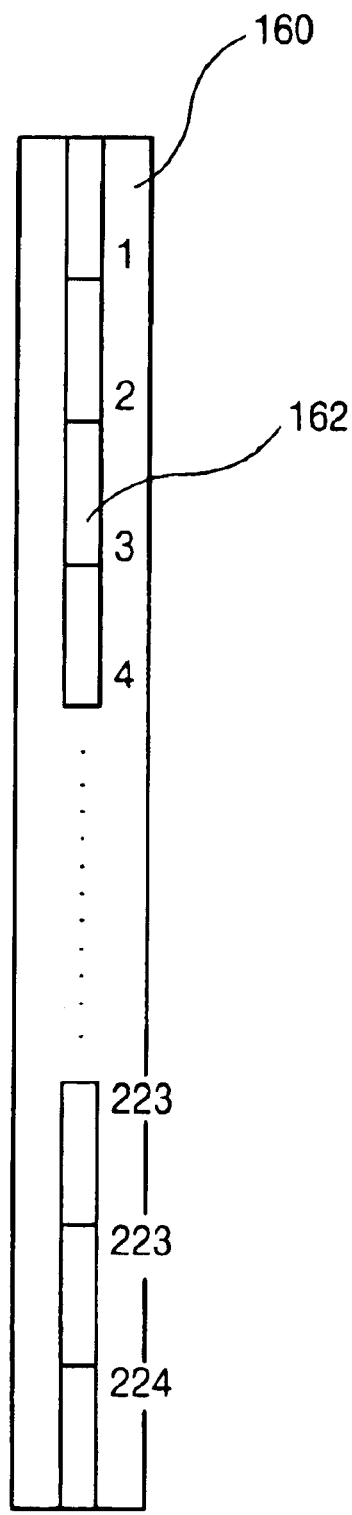
FIG. 5A is a plan view of an exemplary laser head according to the present invention.
Figure 5B:
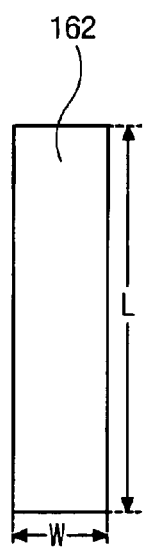
FIG. 5B is a plan view showing an exemplary laser pixel of the laser head of FIG. 5A according to the present invention.

FIG. 5A is a plan view of an exemplary laser head according to the present invention, and FIG. 5B is a plan view showing an exemplary laser pixel of the laser head of FIG. 5A according to the present invention. In FIGS. 5A and 5B, a laser head 160 may have about 224 laser pixels 162 arranged along a line, wherein each of the laser pixels 162 may have a length L of about 5 μm to about 20 μm and a width W of about 3 μm to 5 μm. Of course, the laser pixel 162 may have a different size, i.e., larger or smaller, than the laser pixels 162 when the power of each of the laser pixels 162 is considered. For example, an entire size of the laser pixels 162 within the laser head 160 may be about 4480 μm by about 31 m, and a scan width of the laser head 160 may be about 4480 μm. The laser pixels 162 of the laser head 160 may be automatically operated by a computer system such that each of the laser pixels 162 turn ON and OFF according to red, green, and blue color filter patterns.

Figure 6:
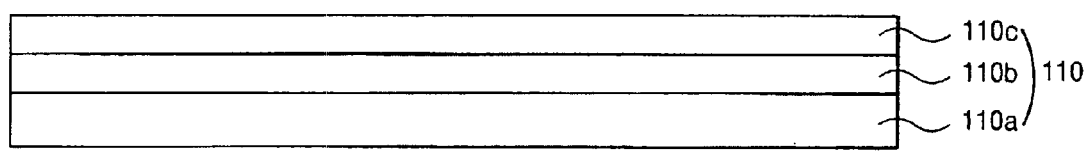
FIG. 6 is a cross sectional view of an exemplary color transcription film according to the present invention.

FIG. 6 is a cross sectional view of an exemplary color transcription film according to the present invention. In FIG. 6, a color transcription film 110 may include three layers: a supporting film 110a; a light-to-heat conversion (LTHC) layer 110b; and a color filter layer 110c. The supporting film 110a, which may support the LTHC layer 110b and the color filter layer 110c, may include a high molecular substance, such as polyester and polyethylene, having transparent and high transmittance characteristics in order to transmit a laser beam to the LTHC layer 110b. The LTHC layer 110b may be formed on the supporting film 110a and may be made of a material that can efficiently convert light into heat energy. Accordingly, the LTHC layer 110b may convert light energy from a laser head into heat energy. The LTHC layer 110b may include an organic material, such as carbon black and IR (infrared) pigments, or an inorganic material, such as a metal material (i.e., aluminum (Al), metallic oxide, or alloy of the above materials). The color filter layer 110c, which may be the layer to be transferred, may be formed on the LTHC layer 110b and may include one of red, green, and blue colors.

FIGS. 7A to 7E are cross sectional views of an exemplary method of fabricating a color filter substrate according to the present invention. Here, a color filter substrate of FIGS. 7A to 7E shows pixels along a line having the same color, for example red, and for convenience of explanation, a laser head may be illustrated to be shortened as compared with a region between black matrixes of a substrate.

Figure 7A:
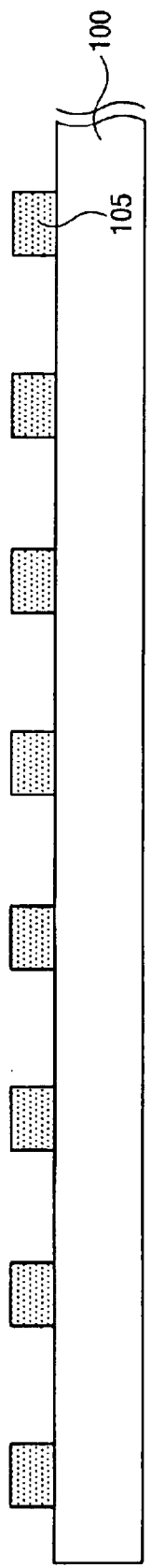
FIGS. 7A to 7E are cross sectional views of an exemplary method of fabricating a color filter substrate according to the present invention.

In FIG. 7A, a black matrix 105 may be formed on an insulating substrate 100 by depositing a metal material, such as chromium (Cr), or coating a resin, such as an epoxy. Then, the metal material or resin may be patterned through photolithographic processes.

Figure 7B:
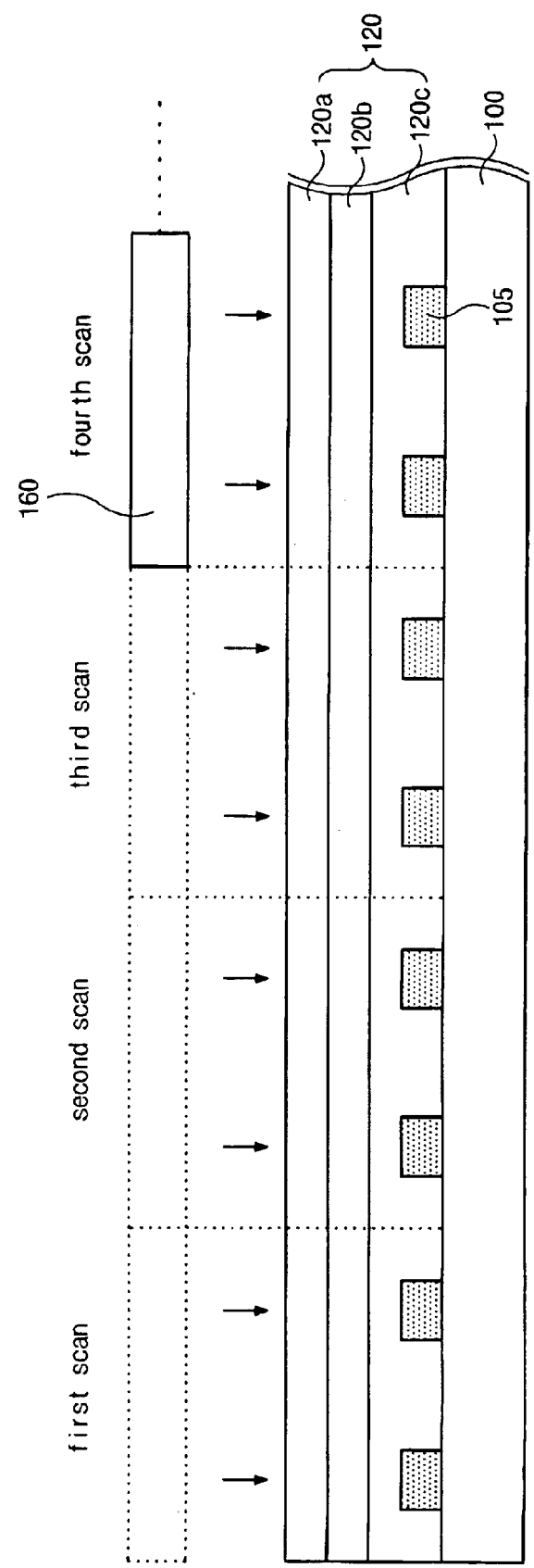

In FIG. 7B, a first color transcription film 120, which may include a supporting film 120a, a light-to-heat conversion (LTHC) layer 120b, and a color filter layer 120c, may be disposed over the substrate 100 including the black matrix 105 with the color filter layer 120c facing the substrate 100. The first color transcription film 120 may be adhered to the substrate 100 without bubbles, and a laser head 160 may be disposed at a distance over the first color transcription film 100. Then, a laser beam of the laser head 160 may be applied to the first color transcription film 120 in a portion where a first color filter pattern will be formed later as the laser head 160 scans the substrate 130 by reciprocating the laser head 160 along a straight line or moving a stage fixing the substrate 100 thereon along a straight line. In the first color transcription film 120 exposed to the laser beam, the LTHC layer 120b may transform light absorbed from the laser beam into thermal energy, thereby emitting thermal energy. Then, the color filter layer 120c may be transferred onto the substrate 100 due to the emitted thermal energy.

In FIGS. 7A to 7E, the color filter substrate may be a stripe-type, wherein color filter patterns along a line may have the same color. Accordingly, a first line may be exposed to the laser beam by moving the laser head along a straight line. However, second and third lines may be skipped. Similarly, a fourth line may be exposed to the laser beam. In this manner, all the lines of the first color filter pattern may be exposed. After a first scan, one of the substrate 100 and the laser head 160 is transferred, and the second, third, and fourth scans may be sequentially performed.

Figure 7C:
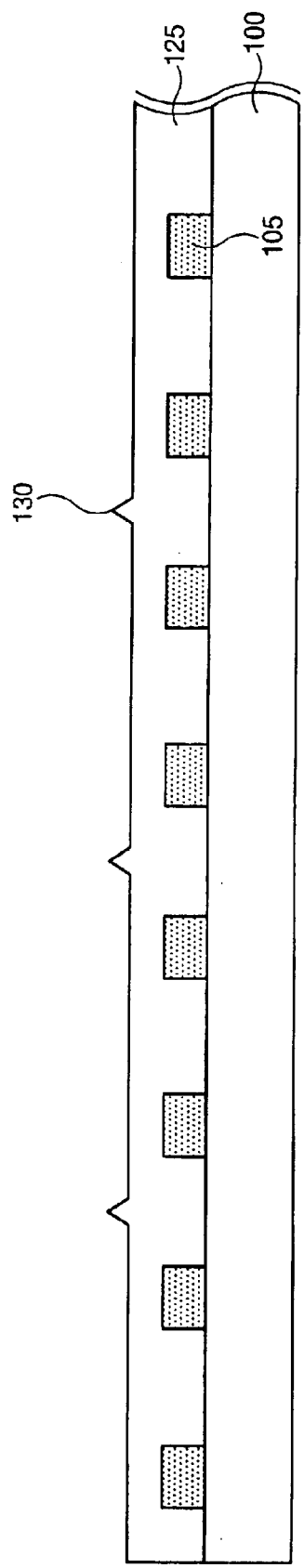

In FIG. 7C, the first color transcription film 120 (in FIG. 7B) may be removed after the whole substrate 100 is scanned. Here, the color filter layer 120c corresponding to the LTHC layer 120b exposed to the laser beam may be transferred onto the substrate 100, while the color filter layer 120c corresponding to the LTHC layer 120b not exposed to the laser beam may be removed together with the color transcription film 120 (in FIG. 7B). Accordingly, a first color filter pattern 125 may be formed both between the adjacent black matrixes 105 on the substrate 100 and on the black matrixes 105. In the example shown, the first color filter pattern 125 may be a red color filter.

Scanning traces 130 may be formed along borders between the first, second, third, and fourth scans on the color filter pattern 125. The scanning traces 130 protrude over the color filter pattern 125. Next, although not shown in the figures, a second color filter pattern and a third color filter pattern may be formed through the same process shown in FIGS. 7B and 7C. The second and third color filter patterns may be green and blue color filters, respectively. Next, the substrate 100 having the color filter pattern 125 may be placed into a hardening furnace, and the color filter pattern 125 may be hardened under temperatures within a range of about 200 degrees of Celsius to about 300 degrees of Celsius.

Figure 7D:
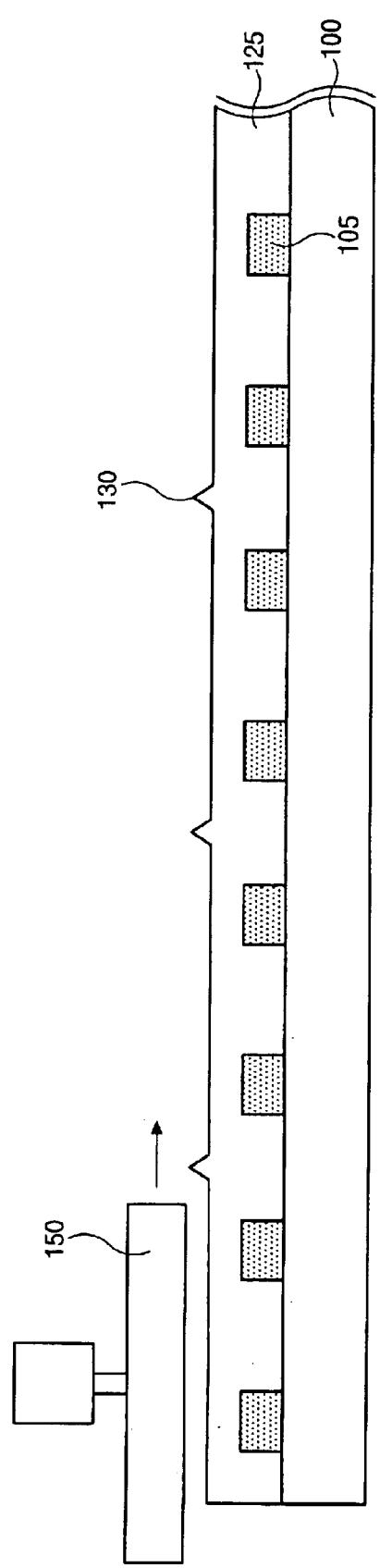

In FIG. 7D, the substrate 100 including the hardened color filter pattern 125 may be situated onto a stage (not shown), and the surface of the color filter pattern 125 may be polished by a chemical mechanical polishing (CMP) process using a polisher 150 moved along the surface of the color filter pattern 125 or by moving the stage. Accordingly, the scanning traces 130 may be removed and the surface of the color filter pattern 125 may be flattened (or planarized). In addition, a surface roughness of the color filter pattern 125 may be improved. The polishing process may be accomplished along an entire surface of the color filter pattern 125, or may be performed within specified portions of the color filter pattern 125.

Figure 7E:
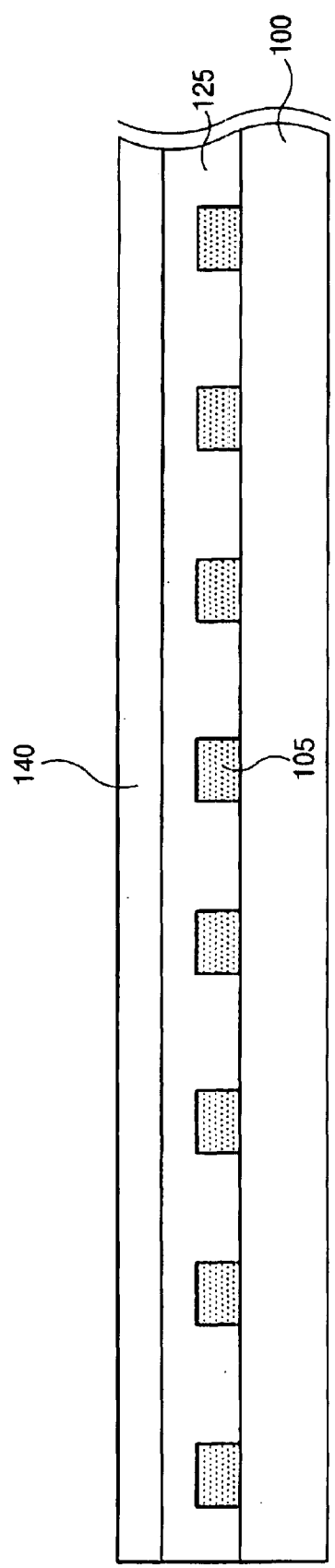

In FIG. 7E, a common electrode 140 may be formed on the color filter pattern 125 by depositing a transparent conductive material, such as indium-tin-oxide and/or indium-zinc-oxide. Thus, an overcoat layer may be formed between the color filter pattern 125 and the common electrode 140 may be omitted since the color filter pattern 125 has a flat surface due to the polishing process.

According to the present invention, since the scanning traces formed along a border between adjacent scans may be removed through a polishing process, such as a CMP process, a liquid crystal display device having high quality images may be provided. In addition, manufacturing costs may be reduced since the overcoat layer may be omitted.

It will be apparent to those skilled in the art that various modifications and variations can be made in the color filter substrate and method of fabricating a color filter substrate of the present invention without departing from the spirit or scope of the invention. Thus, it is intended that the present invention cover the modifications and variations of this invention provided that they come within the scope of the appended claims and their equivalents.

What is claimed is:

1. A method of fabricating a color filter substrate for a liquid crystal display device, comprising steps of:
    forming a black matrix on a substrate;
    adhering a color transcription film to the substrate;
    disposing a laser head over the color transcription film;
    repeatedly scanning a laser beam across a surface of the color transcription film using the laser head;
    removing the color transcription film so that a color filter pattern remains within color filter pattern regions defined by the black matrix; and
    polishing a surface of the color filter pattern to planarize a surface of the color filter pattern.

2. The method according to claim 1, wherein the step of polishing a surface of the color filter pattern includes a chemical mechanical polishing process.

3. The method according to claim 1, wherein the step of polishing a surface of the color filter pattern includes a polisher for polishing an entire surface of the color filter pattern.

4. The method according to claim 1, wherein the step of polishing a surface of the color filter pattern includes a polisher for polishing portions of the surface of the color filter pattern.

5. The method according to claim 1, wherein a border between an n-th number (n is natural number) scan and an (n−1)-th scan corresponds to a region on the color filter pattern region.

6. The method according to claim 1, further comprising a step of hardening the color filter pattern before the step of polishing the surface of the color filter pattern.

7. The method according to claim 6, further comprising a step of forming a common electrode on the surface of the color filter pattern.

8. The method according to claim 1, wherein the color filter pattern is formed on the black matrix.

9. The method according to claim 1, wherein the laser head includes a plurality of laser pixels.

10. The method according to claim 9, wherein each laser pixel has a length along a direction perpendicular to a scan direction within a range of about 5 $\mu$m to about 20 $\mu$m.

11. The method according to claim 9, wherein each laser pixel has a width along a direction parallel to the scan direction of about 3 $\mu$m.

12. A color filter substrate for a liquid crystal display device made by the method according to claim 1.

* * * * *